(12) United States Patent
Danno (10) Patent No.: US 9,951,441 B2
(45) Date of Patent: Apr. 24, 2018

(54) METHOD FOR PRODUCING SIC SUBSTRATE

(71) Applicant: TOYOTA JIDOSHA KABUSHIKI KAISHA, Toyota-shi, Aichi (JP)

(72) Inventor: Katsunori Danno, Susono (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 100 days.

(21) Appl. No.: 14/906,767

(22) PCT Filed: Jul. 17, 2014

(86) PCT No.: PCT/JP2014/069028
§ 371 (c)(1),
(2) Date: Jan. 21, 2016

(87) PCT Pub. No.: WO2015/012190
PCT Pub. Date: Jan. 29, 2015

(65) Prior Publication Data
US 2016/0160384 A1 Jun. 9, 2016

(30) Foreign Application Priority Data
Jul. 24, 2013 (JP) ................. 2013-154005

(51) Int. Cl.
| C30B 19/04 | (2006.01) |
| C30B 23/02 | (2006.01) |
| C30B 25/02 | (2006.01) |
| C30B 29/36 | (2006.01) |
| C30B 19/12 | (2006.01) |
| C30B 17/00 | (2006.01) |

(52) U.S. Cl.
CPC .............. *C30B 19/04* (2013.01); *C30B 17/00* (2013.01); *C30B 19/12* (2013.01); *C30B 23/02* (2013.01); *C30B 25/02* (2013.01); *C30B 29/36* (2013.01)

(58) Field of Classification Search
CPC combination set(s) only.
See application file for complete search history.

(56) References Cited

U.S. PATENT DOCUMENTS

| 5,471,946 A | 12/1995 | Scholz et al. |
| 2002/0096104 A1 | 7/2002 | Yagi et al. |
| 2007/0209573 A1* | 9/2007 | Kusunoki ............... C30B 9/06 117/28 |

(Continued)

FOREIGN PATENT DOCUMENTS

| EP | 2330236 A1 | 6/2011 |
| JP | 6-24900 A | 2/1994 |

(Continued)

*Primary Examiner* — Duy Vu N Deo
*Assistant Examiner* — Erin F Bergner
(74) *Attorney, Agent, or Firm* — Sughrue Mion, PLLC (57) ABSTRACT

A method for producing a SiC substrate with an epitaxial layer, which can prevent inventory of wafers from unduly increasing and wasteful production, is provided. This is achieved by a method for producing a SiC substrate with an epitaxial layer one at a time, the method comprising growing an epitaxial layer and growing a SiC substrate on a seed crystal substrate, and the method further comprising removing the obtained SiC substrate with the epitaxial layer from the seed crystal substrate.

7 Claims, 4 Drawing Sheets

INVENTION PROCESS (56) References Cited

U.S. PATENT DOCUMENTS

| | | | |
|---|---|---|---|
| 2009/0184327 A1* | 7/2009 | Oyanagi | C30B 19/04 257/77 |
| 2013/0220212 A1 | 8/2013 | Kusunoki et al. | |
| 2014/0116325 A1 | 5/2014 | Kamei et al. | |

FOREIGN PATENT DOCUMENTS

| | | |
|---|---|---|
| JP | 6-216050 A | 8/1994 |
| JP | 2002-220299 A | 8/2002 |
| JP | 2003-178983 A | 6/2003 |
| JP | 2008-37684 A | 2/2008 |
| JP | 2010-89983 A | 4/2010 |
| JP | 2012-246168 A | 12/2012 |
| JP | 2013-1619 A | 1/2013 |
| JP | 2013-28475 A | 2/2013 |
| JP | 2013-32254 A | 2/2013 |
| WO | 2012/063743 A1 | 5/2012 |

\* cited by examiner

FIG. 1

PRIOR ART PROCESS

FIG. 2

INVENTION PROCESS

FIG. 3

INVENTION PROCESS

FIG. 4

METHOD FOR PRODUCING SIC SUBSTRATE

CROSS REFERENCE TO RELATED APPLICATIONS

This application is a National Stage of International Application No. PCT/JP2014/069028 filed Jul. 17, 2014, claiming priority based on Japanese Patent Application No. 2013-154005, filed Jul. 24, 2013, the contents of all of which are incorporated herein by reference in their entirety.

TECHNICAL FIELD

The present invention relates to a method for producing a SiC substrate having a SiC epitaxial layer.

BACKGROUND ART

SiC single crystals are thermally and chemically very stable, superior in mechanical strengths, and resistant to radiation, and also have superior physical properties, such as high breakdown voltage and high thermal conductivity compared to Si single crystals. They are therefore able to exhibit high output, high frequency, voltage resistance and environmental resistance that cannot be realized with existing semiconductor materials, such as Si single crystals and GaAs single crystals, and are considered ever more promising as next-generation semiconductor materials for a wide range of applications including power device materials that allow high power control and energy saving to be achieved, device materials for high-speed large volume information communication, high-temperature device materials for vehicles, radiation-resistant device materials and the like.

In the prior art, single crystal SiC devices are fabricated by growing a large-diameter long bulk crystal known as an ingot, on a seed crystal substrate by a sublimation process or the like, cutting out a plurality of SiC wafers to a prescribed thickness from the single ingot, and forming on the SiC wafers the single crystal SiC epitaxial films that are to be the active regions of semiconductor devices. Formation of each single crystal SiC epitaxial film is carried out mainly by using a chemical vapor deposition method (CVD), wherein a starting material is supplied from a gas phase to form a desired epitaxial film (PTL 1).

CITATION LIST

Patent Literature

[PTL 1] Japanese Unexamined Patent. Publication No. 2013-32254

SUMMARY OF THE INVENTION

Problems to be Solved by the Invention

Thus, in the prior art method, several SiC wafers are cut out from a single ingot, in order to reduce costs. Consequently, when the need to subsequently form an epitaxial layer is low, excess inventory of a SiC wafer or wasteful production may occur.

In light, of the above problem, it is an object of the present invention to provide a novel method for producing a SiC substrate.

Means for Solving the Problems

The invention is a method for producing a SiC substrate with an epitaxial layer one at a time, the method comprising growing an epitaxial layer and growing a SiC substrate on a seed crystal substrate, and the method further comprising removing the obtained SiC substrate with the epitaxial layer from the seed crystal substrate.

Effect of the Invention

According to the invention it is possible to produce SiC substrates with epitaxial layers, one set at a time in a consistent process, and therefore it is possible to respond to on-demand orders and to prevent inventory of wafers from unduly increasing and wasteful production.

DESCRIPTION OF EMBODIMENTS

Figure 1:
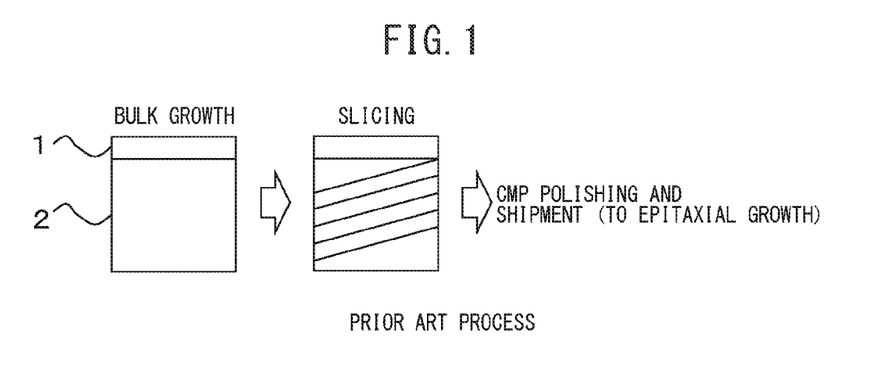
FIG. 1 is a schematic diagram showing a production process for a SiC substrate with an epitaxial layer, according to the prior art.

In the conventional method for producing a SiC substrate with an epitaxial layer, in order to reduce cost, a long SiC bulk crystal 2 is grown on a SiC seed crystal substrate 1 by a sublimation process, and multiple SiC wafers are sliced from the SiC bulk crystal 2, as shown in FIG. 1. Consequently, if demand for epitaxial layer formation is low, excessive production of SIC wafer inventory increases, and wasteful production has resulted.

In addition, when an epitaxial layer is formed by a chemical vapor deposition (CVD) method, in order to grow an epitaxial layer on a face with an offset angle, for example, when a SiC bulk crystal 2 grown on the on-axis plane has been used, the wafers must be cut off by slicing in an oblique manner from the SiC bulk crystal 2 so as to form the prescribed offset angle, as shown in FIG. 1. Since oblique slicing is thus carried out from the SiC bulk crystal 2 so as to form the prescribed off-angle, sections to be discarded are generated at both ends of the SiC bulk crystal 2.

In addition, since the epitaxial layer is formed on the SiC wafer as a substrate, high quality is also demanded for the SiC wafer in addition to the original need only to ensure quality for the epitaxial layer. To ensure the quality of the epitaxial layer, it is necessary to carry out a separate cut or a chemical mechanical polishing (CMP polishing) on all of the wafers cut out from the SiC bulk crystal 2.

In contrast to this prior art, the present invention is a method of producing a single SiC substrate with an epitaxial layer one at a time, using a seed crystal substrate. A set of a SiC substrate with an epitaxial layer is produced on a seed crystal substrate, and then the set of the SiC substrate with the epitaxial layer is cut away from the seed crystal substrate. The SiC substrate with the epitaxial layer obtained in this manner can subsequently be sent to an element fabrication process.

The invention relates to a method for producing a SiC substrate with an epitaxial layer one at a time, the method comprising growing an epitaxial layer and growing a SiC substrate on a seed crystal substrate, and the method further comprising removing the obtained SiC substrates with epitaxial layers from the seed crystal substrates.

According to the invention it is possible to produce SiC substrates with epitaxial layers, one set at a time in a consistent process, and therefore it is possible to respond to on-demand orders and to prevent inventory of wafers from unduly increasing and wasteful production.

The SiC substrate is a substrate supporting an epitaxial layer, and is generally a thick film with relatively low electric resistivity. The nitrogen density is generally about $10^{18}/cm^3$ or greater. The film thickness may be, for example, 150 to 500 μm or 200 to 400 μm.

The epitaxial layer is a layer that functions as the active layer in which the element operates, and generally it is a thin-film with relatively high electric resistivity, except in cases where an n-type semiconductor or the like is to be formed. In cases without nitrogen doping or the like, the epitaxial layer is a high-purity thin-film with relatively few impurities, and the nitrogen density is generally about $10^{14}$ to $10/cm^3$. The epitaxial layer may also be doped with nitrogen to a nitrogen density of, for example, about $10^{16}$ to $10^{17}/cm^3$. The film thickness will depend on the design of the element, and may be, for example, 5 to 200 μm, 10 to 30 μm or 10 to 20 μm.

Embodiment 1

Figure 2:
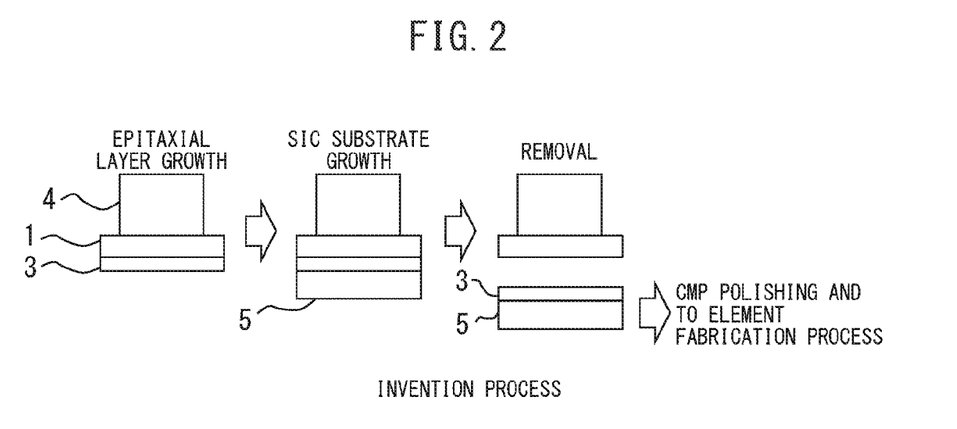
FIG. 2 is a schematic diagram showing a production process for a SiC substrate with an epitaxial layer, according to the present invention.

According to one embodiment of the invention, as shown in FIG. 2, an epitaxial layer 3 may be grown on a seed crystal substrate 1, and a SiC substrate 5 may be grown on the epitaxial layer 3.

The epitaxial layer 3 can be grown using a solution process or CVD process. It is preferred to use a solution process for growth of the epitaxial layer 3.

When a CVD process is used to grow the epitaxial layer, it is necessary to form an offset angle to the growth surface of the seed crystal substrate. On the other hand, when a solution process is used to grow the epitaxial layer, it is possible to conduct onset (on-axis plane)-growth without the need to form an offset angle, and this can therefore prevent propagation of base plane dislocation of the seed crystal substrate to the epitaxial layer 3. Furthermore, when a solution process is used to grow the epitaxial layer, it is possible to avoid the downfall that can occur with CVD processes.

In addition, when a solution process is used for growth of the epitaxial layer 3, it is preferred to conduct (000-1) C-surface growth or (0001) Si-surface growth, and it is more preferred to conduct Si-surface growth. While it is difficult to form a thick film by Si-surface growth in a solution process, a high-quality film with low dislocation can be obtained if the thin-film is no greater than about 500 μm.

The SiC substrate 5 can be grown by a solution process, high temperature CVD process or sublimation process. It is preferred to grow the SiC substrate 5 by a solution process. By growing the SiC substrate 5 by a solution process it is possible to grow the SiC substrate 5 with a rapid growth rate, and to obtain a high-quality substrate with few defects since crystal growth in a state of near thermal equilibrium can be accomplished.

More preferably, the SiC substrate 5 is formed using a solution process after the epitaxial layer 3 has been formed by a solution process.

In this embodiment, it is necessary to perform CMP polishing on the growth surface of the seed crystal substrate prior to forming the epitaxial layer on the seed crystal substrate, but when the SiC substrate is grown on the epitaxial layer, it is not necessary to perform CMP polishing on the growth surface of the epitaxial layer.

Since the epitaxial layer is formed first according to this embodiment, the quality of the SiC substrate that is grown thereafter does not need to be high. For example, there is no problem even with generation of dislocations or polytype inclusions, and even inclusions of the solvent are not problematic if they are on the microlevel.

Thus, since the quality of the SiC substrate does not need to be high, CMP polishing of the epitaxial layer before growth of the SiC substrate is unnecessary, and cost can be reduced. Furthermore, this allows specialization of high-speed growth for growth of the SiC substrate, and cost can be reduced from this standpoint as well.

Typically, offset-growth is used in CVD processes while onset-growth is used in solution processes. However, when the thickness required for the SiC substrate is 500 μm or smaller, the SiC single crystal can be grown using offset-growth in a solution process. In this embodiment, therefore, CVD may be used for offset-growth of the epitaxial layer on the growth surface of the seed crystal substrate at an offset angle, and a solution process may be used for offset-growth of the SiC substrate.

When the thickness required for the SiC substrate 5 to be grown is approximately 500 μm or smaller, preferably a solution process is used for (000-1) C-surface growth or (0001) Si-surface growth, and more preferably for Si-surface growth. While it is difficult to form a thick film by Si-surface growth in a solution process, 4H stability can be easily achieved and high-quality SiC substrates with low dislocation can be obtained in the case of Si-surface growth, if the thickness is no greater than about 500 μm.

In this embodiment, growth of the SiC substrate is followed by removal of the SiC substrate with the epitaxial layer from the seed crystal substrate. The method of removing the SiC substrate with the epitaxial layer may employ a wire-saw or the like.

After the SiC substrate with the epitaxial layer has been removed, necessary working, such as CMP polishing of the epitaxial layer, may be carried out as a post-step.

In this embodiment, the epitaxial layer can be grown more thickly by the amount that will be cut of or polished off.

After the SiC substrate with the epitaxial layer has been removed, the growth surface of the seed crystal substrate may be subjected to CMP polishing, growth of an epitaxial layer repeated, and a SiC substrate grown on the epitaxial layer. In this embodiment, after the seed crystal substrate has first been attached to a graphite shaft, the growth surface of the seed crystal substrate can be subjected to CMP polishing while the seed crystal substrate is attached to the graphite shaft, thereby allowing any subsequent procedure of attaching the seed crystal substrate to the graphite shaft to be omitted.

Embodiment 2

Figure 3:
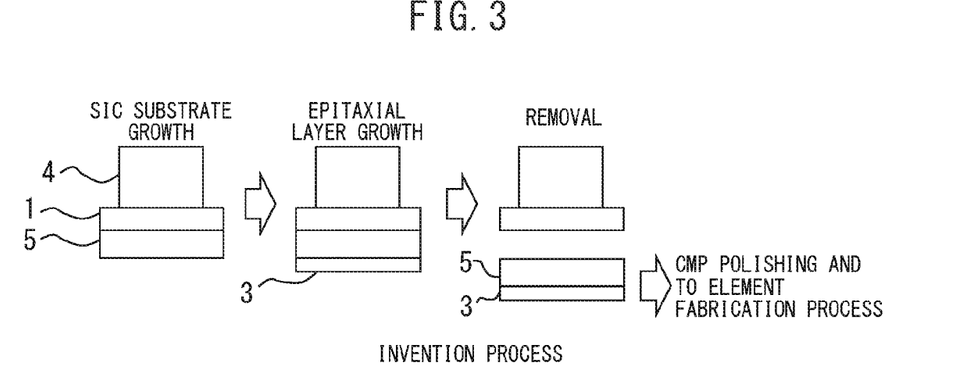
FIG. 3 is a schematic diagram showing a production process for a SiC substrate with an epitaxial layer, according to the present invention.

According to a different embodiment of the invention, as shown in FIG. 3, a SiC substrate 5 may be grown on a seed crystal substrate 1, and an epitaxial layer 3 may be formed on the SiC substrate 5.

The SiC substrate 5 can be grown by a solution process, high temperature CVD process or sublimation process. The epitaxial layer 3 can be grown using a solution process or CVD process. Preferably, a solution process is used for growth of the epitaxial layer 3.

When the thickness required for the SiC substrate 5 to be grown is approximately 500 μm or smaller, preferably a solution process is used for (000-1) C-surface growth or (0001) Si-surface growth, and more preferably for Si-surface growth. While it is difficult to form a thick film by Si-surface growth in a solution process, 4H stability can be easily achieved and high-quality SiC substrates with low dislocation can be obtained in the case of Si-surface growth, if the thickness is no greater than about 500 μm.

When a CVD process is used to grow the epitaxial layer 3, it is necessary to first form an offset plane on the SiC substrate to be grown, in order to accomplish offset-growth. When the SiC substrate does not have an offset plane, it is necessary to slice or polish the SiC substrate in an oblique manner to form an offset angle. On the other hand, when a solution process is used to grow an epitaxial layer, it is not necessary to form an offset angle since it is possible to conduct onset-growth. Therefore, when onset-growth has been conducted to grow a SiC substrate, a solution process may be used to conduct epitaxial growth on the same plane.

In this embodiment the epitaxial layer is grown after first growing the SiC substrate, and therefore the quality of the SiC substrate layer is also important. It is therefore necessary to grow the SiC substrate layer after CMP polishing of the growth surface of the seed crystal substrate, and to also perform CMP polishing on the growth surface of the SiC substrate before growth of the epitaxial layer.

After the epitaxial layer has been grown, the SiC substrate with the epitaxial layer is removed from the seed crystal substrate. The method of removing the SiC substrate with the epitaxial layer may employ a wire-saw or the like.

After the SiC substrate with the epitaxial layer has been removed, necessary working, such as CMP polishing of the epitaxial layer, may be carried out as a post-step.

After the SiC substrate with the epitaxial layer has been removed, the growth surface of the seed crystal substrate may be subjected to CMP polishing, growth of a SiC substrate repeated, and an epitaxial layer grown on the SiC substrate. In this embodiment, after the seed crystal substrate has first been attached to a graphite shaft, the growth surface of the seed crystal substrate can be subjected to CMP polishing while the seed crystal substrate is attached to the graphite shaft, thereby allowing any subsequent procedure of attaching the seed crystal substrate to the graphite shaft to be omitted.

In the method of the invention, a SiC single crystal having quality commonly used for production of SiC single crystals may be used as the seed crystal. For example, a SiC single crystal commonly formed by a sublimation process may be used as the seed crystal. The seed crystal to be used for this method may have any desired shape, such as laminar, discoid, cylindrical, columnar, truncated circular conic or truncated pyramidal.

As described above, a solution process or CVD process may be used for growth of the epitaxial layer, while a solution process, sublimation process or high-temperature CVD process may be used for growth of the SiC substrate.

One example of a crystal growth method by a solution process that can be used in the method of the invention will now be described, with the understanding that the crystal growth method by a solution process is not limited to the described embodiment.

In the solution process, molten Si or an alloy melted in molten Si may be situated in a graphite crucible and C may be dissolved from the graphite crucible into the molten liquid, and a SiC crystal layer may be deposited and grown on a seed crystal substrate set in the low temperature section.

Figure 4:
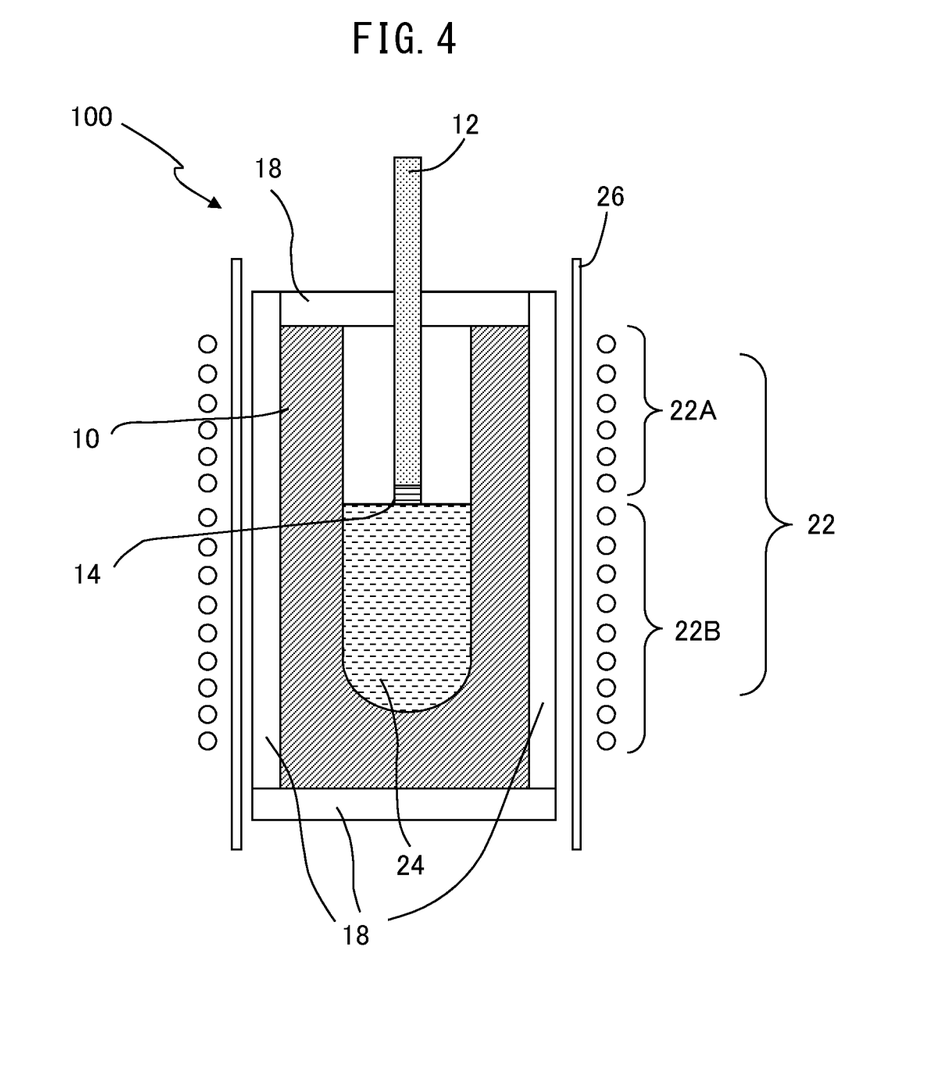
FIG. 4 is a cross-sectional schematic drawing showing an example of the construction of a SiC crystal production apparatus employing a solution process that can be used for the invention.

FIG. 4 shows a cross-sectional schematic drawing of an example of a SiC crystal production apparatus that may be used in a solution process to carry out the production method of the invention. The illustrated SiC crystal production apparatus 100 comprises a crucible 10, wherein the crucible 10 receives a Si—C solution 24 having C dissolved in a molten liquid of Si or Si/X, a temperature gradient is formed in which the temperature is decreased from the interior of the Si—C solution 24 toward the surface of the Si—C solution 24, and the seed crystal substrate 14 that is held at the tip of the vertically movable seed crystal holding shaft 12 is contacted with the Si—C solution 24 to allow growth of the SiC crystal from the seed crystal substrate 14.

The Si—C solution 24 is prepared by loading starting materials into the crucible, melting them by heating to prepare Si or Si/X molten liquid, and dissolving C therein. X is not particularly restricted so long as it is one or more metals and can form a liquid phase (solution) that is in a state of thermodynamic equilibrium with SiC (the solid phase). Suitable examples of X metals include Ti, Mn, Cr, Ni, Ce, Co, V and Fe. For example, Cr, Ni and the like may be loaded into the crucible in addition to Si, to form a Si—Cr solution, Si—Cr—Ni solution or the like. If the crucible 10 is a carbonaceous crucible, such as a graphite crucible, or SiC crucible, C will dissolve into the molten liquid by dissolution of the crucible 10, thereby forming a Si—C solution. This will avoid the presence of undissolved C in the Si—C solution 24, and prevent waste of SiC by deposition of the SiC crystal onto the undissolved C. The supply of C may be performed by utilizing a method of, for example, blowing in hydrocarbon gas or loading a solid C source together with the other molten liquid starting material, or these methods may be combined together with dissolution of the crucible.

When an epitaxial layer is to be grown in a solution process, the epitaxial layer will generally be a thin-film with a thickness of about 10 to 30 μm having relatively few impurities, and therefore the growth rate does not need to be rapid, and preferably a Si molten liquid is used for growth of the SiC epitaxial layer.

The SiC substrate will generally be a thick film that is a relatively thick film and has relatively low resistivity, and therefore a rapid growth rate is preferred even with some inclusion of impurities, and when the SiC substrate is to be grown by a solution process, it is preferred to use a Si/X molten liquid for growth of the SiC substrate.

The surface temperature of the Si—C solution 24 is preferably 1800 to 2200° C., which will allow the amount of dissolution of C to be increased.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

The seed crystal holding shaft 12 may be a graphite shaft that holds the seed crystal substrate on its end face, and there may be used a graphite shaft of any desired shape, such as cylindrical or columnar.

For thermal insulation, the outer periphery of the crucible 10 may be covered with a heat-insulating material 18. These may be housed together inside a quartz tube 26. A heating device is disposed around the heat-insulating material 18. The heating device may be, for example, a high-frequency coil 22. The high-frequency coil 22 may be configured with an upper level coil 22A and a lower level coil 22B. The upper level coil 22A and lower level coil 22B can be independently regulated.

Since the temperatures of the crucible 10, the heat-insulating material 18, and the heating device, such as the high-frequency coil 22, become high, they may be situated inside a water-cooling chamber. The water-cooling chamber may be provided with a gas inlet and a gas exhaust vent to allow atmospheric modification in the apparatus.

The temperature of the Si—C solution. 24 generally has a temperature distribution in which the temperature of the surface of the Si—C solution 24 is lower than the interior thereof due to radiation and the like. Further, when the heating device is a high-frequency coil 22 comprising an upper level coil 22A and a lower level coil 22B, the outputs of the upper level coil 22A and lower level coil 22B may be separately adjusted to form a temperature gradient with a prescribed temperature reduction from the interior of the Si—C solution 24 to the surface region. The temperature gradient may be about 10 to 50° C./cm, in a range to about a 30 mm depth from the solution surface, for example.

The C that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from the heating device, heat radiation from the surface of the Si—C solution 24, and heat loss through the seed crystal holding shaft 12. When the C that has dissolved into the solution interior where the temperature and the solubility are high, reaches the region near the seed crystal substrate where the temperature and the solubility are low, a supersaturated state appears and a SiC crystal is grown on the seed crystal substrate 14 by virtue of supersaturation as a driving force.

One example of a crystal growth method by a sublimation process that can be used in the method of the invention will now be described, with the understanding that the crystal growth method by a sublimation process is not limited to the described method.

A crystal growth step for crystal growth of a SiC crystal based on a sublimation process will now be described. For production of a SiC crystal by a sublimation process, SiC powder as a starting material is loaded into a crucible in which a seed crystal substrate is set, and then the crucible is set inside a crystal growth apparatus. Next, the interior of the crystal growth apparatus is filled with an inert gas atmosphere, and the pressure is reduced. Next, the crystal growth apparatus is heated to 1800° C. to 2400° C. This allows the SiC powder inside the crucible to dissolve and sublimate to generate sublimated chemical species (gas), which reach the crystal growth plane of the seed crystal held in the crystal growth temperature range to carry out epitaxial growth of the SiC crystal.

Figure 5:
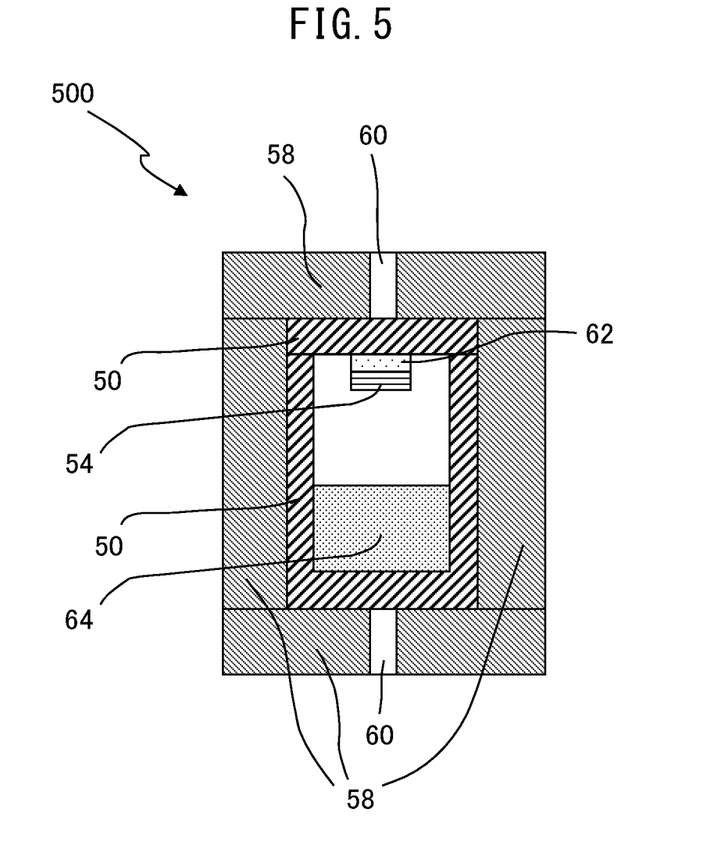
FIG. 5 is a cross-sectional schematic drawing showing an example of the construction of a SiC crystal production apparatus employing a sublimation process that can be used for the invention.

FIG. 5 is a cross-sectional schematic drawing of an example of a SiC crystal production apparatus that may be used in a sublimation process to be used to carry out the production method of the invention. As shown in FIG. 5, the crystal growth apparatus 500 comprises a crucible 50 filled with a SiC starting powder 64 in a sufficient amount for crystal growth of a SiC crystal, and a heat-insulating material 58 situated on the sides and above and below the crucible 50, and it is placed in a vacuum container with a gas inlet and a gas outlet allowing evacuation with an evacuation device and pressure control of the internal atmosphere with an inert gas, such as Ar.

The material of the crucible 50 may be, for example, a carbon material, such as graphite. The vacuum container can be formed of a material that retains a high vacuum, such as quartz or stainless steel. The material of the heat-insulating material 58 may be, for example, a carbon material, such as carbon fibers.

A portion of the top of the crucible 50 protrudes in a cylindrical form, forming a stage 62 for mounting of the SiC seed crystal substrate 54, where the seed crystal substrate 54 is held. Holding onto the mounting stage 62 of the seed crystal substrate 54 may be carried out, for example, by bonding using a graphite adhesive.

A heating device is situated on the exterior of the vacuum container, and heating can be carried out by, for example, using a high-frequency coil wrapped around the periphery of the vacuum container.

The crucible temperature can be measured, for example, by providing an optical path 60 with a diameter of 2 to 4 mm at the center section of the heat-insulating material 58 covering the bottom of the crucible, to take out light from below the crucible, and performing measurement with a radiation thermometer. This temperature may be considered to be the temperature of the starting material. An optical path 60 is similarly provided at the center of the heat-insulating material 58 covering the top of the crucible, allowing measurement of the temperature of the crucible 50 in the same manner. This may be considered to be the temperature of the seed crystal.

The seed crystal substrate 54 may be held on a mounting stage 62, and crystal growth may be carried out in the following manner, for example.

The atmosphere in the vacuum container is substituted with an inert gas, such as high-purity argon gas. Next, the vacuum container and the crucible 50 situated inside it are heated with a heating device, such as a high-frequency heating coil disposed surrounding the vacuum container. The heating device is not limited to a high-frequency heating coil, and may instead be a resistance heating system.

The position of the heating device, such as a high-frequency heating coil, is adjusted so that the top of the crucible 50 is the low temperature section and the bottom of the crucible 50 is the high temperature section. This efficiently generates sublimation gas from the SiC powder 64 at the bottom of the crucible 50, and cools the sublimation gas at the top of the crucible 50, thereby allowing crystal growth of a SiC crystal from the seed crystal substrate 54.

Preferably, growth is initiated with the starting material temperature set to 2100° C. to 2500° C. and more preferably 2200° C. to 2400° C., in order to facilitate gasification of the starting materials and to facilitate growth of a high quality crystal. The seed crystal temperature is preferably set to be 40 to 100° C. and more preferably 50 to 70° C. lower than the starting material temperature, and the temperature gradient is preferably set to be 5 to 25° C./cm and more preferably 10 to 20° C./cm.

Next, with the crucible 50 at the preset temperature, the inert gas is evacuated through a gas outlet to create a reduced pressure state inside the vacuum container of about 133.3 to 13332.2 Pa, thereby producing crystal growth of the SiC crystal on the seed crystal 54. By conducting crystal growth for a fixed time period, it is possible to produce crystal growth of a SiC crystal having a prescribed size.

One example of a crystal growth method by a chemical vapor deposition (CVD) process that can be used in the method of the invention will now be described, with the understanding that the crystal growth method by CVD is not limited to the described method.

CVD is a process in which a source gas, such as silane or propane, is supplied while heating the reaction chamber of the CVD apparatus to about 1400 to 1800° C., to accomplish growth of a SiC epitaxial film. The SiC substrate may be grown by a CVD process, and it is preferred to use a temperature above 2000° C., in which case the process is referred to as high-temperature CVD. Since epitaxial growth of SiC by a CVD process is based on step-flow growth, the substrate used as the origin for growth is a substrate inclined by about 4 to 8 degrees in the (11-20) direction from the (0001) Si face, in order to accomplish stable epitaxial growth.

Figure 6:
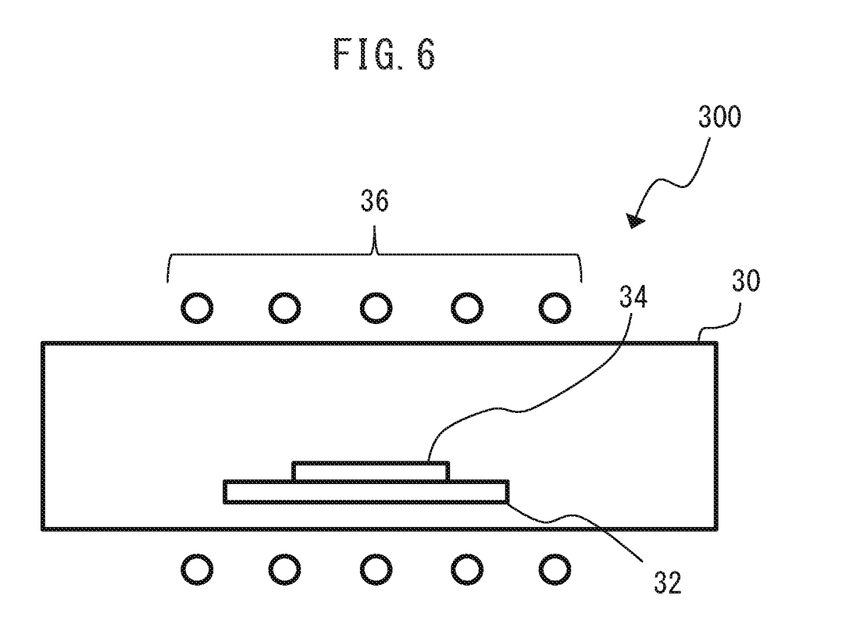
FIG. 6 is a cross-sectional schematic drawing showing an example of the construction of a SiC crystal production apparatus employing a chemical vapor deposition (CVD) process that can be used for the invention.

FIG. 6 is a cross-sectional schematic drawing of an example of a SiC crystal production apparatus 300 that may be used in a CVD process (including high-temperature CVD) to be used to carry out the production method of the invention.

The CVD reactor 30 comprises a susceptor 32 for holding of the substrate 34 for growth of the SiC single crystal. The CVD reactor 30 has a heater (high-frequency coil) 36 disposed on the outer periphery, for heating to and maintenance of the reaction temperature. The reaction temperature for formation of the SiC single crystal is, for example, about 1400 to 1800° C., as the substrate temperature. The CVD reactor 30 can be reduced in pressure to the necessary degree of vacuum by an exhauster (not shown) connected to one end thereof. The reaction temperature can be continuously detected with a radiation thermometer and a thermocouple (not shown). The radiation thermometer covers mainly the high-temperature range of 600 to 1800° C., and the thermocouple covers the total temperature range from room temperature to 1800° C.

The carrier gas supply source, silicon gas supply source, hydrocarbon gas supply source, and doping gas supply source (not shown) are connected to a common gas supply tube (not shown) through opening and closing valves and flow rate controllers (not shown), which can each be independently operated, and the gas supply tube is connected to the other end of the CVD reactor 30. The carrier gas used will generally be hydrogen ($H_2$) gas, but there is no limitation thereto and it may be any gas that does not affect the CVD reaction whereby the SiC single crystal is formed.

As an example of the CVD conditions, they may be a seed crystal substrate having a (0001) Si surface with an offset angle of 5°, a temperature of 1500° C., an atmosphere pressure of 11 kPa, 30 slm $H_2$ gas as the carrier gas, 8 sccm. $SiH_4$ gas and 4 sccm $C_3H_8$ gas as the source gases, and 20 sccm $N_2$ gas as the doping gas, with 40 to 120 minutes of growth, to grow an epitaxial layer with a thickness of, for example, 10 to 30 μm.

When a CVD process is used to grow an epitaxial layer, the temperature range for growth is preferably 1500 to 1700° C., and when a high-temperature CVD process is used to grow a SiC substrate, for a rapid growth rate, the growth temperature is preferred to be relatively high, with growth in a temperature range of preferably 2200 to 2500° C.

EXPLANATION OF SYMBOLS

1 Seed crystal substrate
2 SiC bulk crystal
3 Epitaxial layer
4 Seed crystal holding shaft
5 SiC substrate
100 Crystal production apparatus used in solution process
10 Crucible
12 Seed crystal holding shaft
14 Seed crystal substrate
18 Heat-insulating material
22 High-frequency coil
22A Upper level high-frequency coil
22B Lower level high-frequency coil
24 Si—C solution
26 Quartz tube
300 Crystal production apparatus used in CVD process
30 CVD reactor
32 Susceptor
34 Substrate
36 Heater (high-frequency coil)
500 Crystal production apparatus used in sublimation process
50 Crucible
54 Seed crystal
58 Heat-insulating material
60 Optical path
62 Seed crystal mounting stage
64 SiC starting powder

What is claimed is:

1. A method for producing an SiC substrate with an epitaxial layer one at a time,
   the method comprising growing a SiC epitaxial layer on a seed crystal substrate by a solution process using a Si molten liquid and growing a SiC substrate on the grown SiC epitaxial layer by a solution process, and
   the method further comprising removing the obtained SiC substrate with the SiC epitaxial layer from the seed crystal substrate,
   wherein the nitrogen density of the SiC epitaxial layer is $10^{17}/cm^3$ or less, and
   the nitrogen density of the SiC substrate is $10^{18}/cm^3$ or greater.

2. The method according to claim 1, wherein the growing the SiC substrate by the solution process comprises using a Si/X molten liquid, wherein X is selected from Ti, Mn, Cr, Ni, Ce, Co, V and Fe.

3. The method according to claim 1, wherein the seed crystal substrate has been CMP-polished.

4. The method according to claim 1, wherein the growing the SiC epitaxial layer comprises conducting onset-growth.

5. The method according to claim 1, wherein the growing the SiC epitaxial layer comprises conducting (000-1) C-surface growth or (0001) Si-surface growth.

6. The method according to claim 1, wherein the growing the SiC substrate comprises conducting (000-1) C-surface growth or (0001) Si-surface growth.

7. The method according to claim 1, wherein the growing the SiC epitaxial layer comprises growing the SiC epitaxial layer to a thickness of 5 to 200 μm, and the growing the SiC substrate comprises growing the SiC substrate to a thickness of 150 to 500 μm.

* * * * *